（12） United States Patent
Stimpson

(10) Patent No.: US 6,388,345 B1
(45) Date of Patent: May 14, 2002

(54) CORNER LIGHT SWITCH ASSEMBLY

(75) Inventor: Aaron N. Stimpson, 6532 16th Ave. S, Apt#104, Richfield, MN (US) 55423

(73) Assignee: Aaron N. Stimpson, Garden City, KS (US)

( * ) Notice: Subject to any disclaimer, the term of this patent is extended or adjusted under 35 U.S.C. 154(b) by 0 days.

(21) Appl. No.: 09/562,090

(22) Filed: May 1, 2000

(51) Int. Cl.⁷ .............................................. H01H 35/00
(52) U.S. Cl. ........................ 307/119; 307/112; 307/154; 307/157; 174/66
(58) Field of Search .................................. 307/112, 116, 307/119, 134, 154, 157; 174/66

(56) References Cited

U.S. PATENT DOCUMENTS

| | | | | |
|---|---|---|---|---|
| 5,293,097 A | * | 3/1994 | Elwell | 307/116 |
| 5,637,930 A | * | 6/1997 | Rowen et al. | 307/112 |
| 5,719,450 A | * | 2/1998 | Vora | 307/116 |

* cited by examiner

Primary Examiner—Fritz Fleming

(57) ABSTRACT

A corner light switch assembly to be mounted against a corner edge of a wall corner at a predetermined location and vertical height. The corner light switch assembly includes 1) a main switch body; 2) a switch body cover plate of L-shape constructed of a transparent plastic material connected to the main switch body; 3) a touch sensitive switch assembly mounted in the main switch body and engageable with the switch body cover plate; and 4) a power supply cord to connect an appliance, table lamp or light fixture to the touch sensitive switch assembly for selective operation thereof The switch body cover plate has a sensor section with a plurality of sensor openings therein. The touch sensitive switch assembly includes a touch plate sensor connected to a touch sensitive switch circuit. The touch plate sensor is placed within one of the sensor openings in the sensor section of the switch body cover plate and having the touch plate sensor mounted therein. The touch sensitive switch circuit is known in the prior art.

13 Claims, 2 Drawing Sheets

CORNER LIGHT SWITCH ASSEMBLY

PRIOR ART

A patent search was conducted on this invention and the following United States patents are noted:

| U.S. Pat. No. | Invention | Inventor |
|---|---|---|
| 4,152,629 | LAMP RESPONSIVE TO THE HUMAN TOUCH UPON A LIVING PLANT AND CONTROL SYSTEM THEREFOR | Harry F. Raupp |
| 4,264,831 | TOUCH CONTROL SWITCH | Lars A. Wern |
| 4,289,980 | TOUCH SENSITIVE ELECTRIC SWITCH | Richard J. McLaughlin |
| 4,360,737 | TOUCH SENSITIVE SWITCH | Howard S. Leopold |
| 4,668,877 | TOUCH CONTROLLED SWITCH FOR A LAMP OR THE LIKE | Scott M. Kunen |
| 4,672,229 | WALL-MOUNTED TOUCH CONTROL SWITCH | Skarman et al |
| 4,926,062 | TOUCH CONTROL CIRCUIT FOR ORNAMENTAL LAMPS AND METHOD THEREFORE | Ussery et al |

The patent search was conducted on a touch sensitive light switch having sensors that are touch sensitive and covered with a smudge-proof template made of transparent plastic material. The light switch is made in a 90 degree shape so as to be mounted on a corner of a doorway; corner edge of a wall corner; or the like instead of on a vertical wall surface. This allows for the light switch to be easily found in the dark for turning on a light fixture or appliance.

Numerous references were found having touch control switches for touch sensitive switches as shown on the Raupp, Wem, McLaughlin, Leopold, and Kunen patents.

A wall-mounted touch control switch is shown in the Skarman patent but is not corner mounted.

PREFERRED EMBODIMENT OF THE INVENTION

In one preferred embodiment of this invention, a corner light switch assembly is provided having 1) a main switch body similar to an electrical receptacle box; 2) a switch body cover plate connected to and mounted about the main switch body; 3) a touch sensitive switch assembly, being three thereof, mounted within the main switch body and having a portion engageable with the switch body cover plate; and 4) a power supply cord operable to provide normal 120 volt AC power to the respective ones of the touch sensitive switch assemblies.

The main switch body includes a receptor box which is secured to a corner portion of a wall corner by anchor, members in a conventional manner.

The wall corner includes an outer corner edge to which the corner light switch assembly is to be attached.

The corner edge of a dividing, wall is a preferred application for this invention as it would be easy to find in the dark to be used in a manner to be described in detail.

The switch body cover plate is constructed of a transparent plastic material and being of substantially L-shape. The switch body cover plate includes a support section integral with a sensor section which extends 90 degrees from the support section.

The sensor section is provided with a plurality, namely three, spaced sensor openings to receive a portion of a respective one of the touch sensitive switch assemblies therein.

Each touch sensitive switch assembly includes a touch plate sensor which is energized, controlled and powered by a touch sensitive switch circuit. The touch plate sensor is preferably of a circular shape and to be placed within the sensor openings in the sensor section of the switch body cover plate.

When the touch plate sensor is contacted by a person through its finger member, this creates a grounded circuit to turn on a light circuit in a remote location such as a family room, lights on a stairway, garage lights, an appliance, or other such place to which the touch sensitive switch circuit is attached.

The touch sensitive switch circuit is well known in the prior art and operates similar to the well known use of similar circuits on a brass lamp so that the light is turned on, dimmed, and brightened merely by the touching of an outer surface of a brass lamp. In fact, the applicant's invention herein is not specifically directed to any touch sensitive switch assembly and numerous types thereof are well known in the prior art. The disclosure herein relates to such a known circuitry for a touch sensitive switch, inventor Howard S. Leopold, Patent No. 4,360,737 issued on Nov. 23, 1982.

The power supply cord is operable to be attached to an appliance or a lighting fixture such as a ceiling light, table lamp, or the like in order to energize same on touching of the touch plate sensor. This invention relates to utilizing three of the touch plate sensors so that three different light fixtures or appliances can be energized independently merely by the touching of the respective touch plate sensor by a person's finger.

OBJECTS OF THE INVENTION

One object of this invention is to provide a corner light switch assembly having a main switch body and a switch body cover plate connected thereto presenting a 90 degree structure which can be readily mounted on a corner edge of a wall corner so as to present a touch plate sensor which can be readily touched an located after one finds the corner edge, even in darkness, in order to then easily energize an appliance or a light fixture by the mere touching of a touch plate sensor.

Another object of this invention is to provide a corner light switch assembly of a generally 90 degree shape so as to be placed against and secured to a corner edge on a wall corner and having a plurality of touch plate sensors, each operable independently through a touch sensitive switch circuit to energize any remote located appliance or light fixture connected thereto.

One other object of this invention is to provide a corner light switch assembly to be mounted on a corner edge of a wall corner and having a switch body cover plate of a 90 degree shape constructed of a transparent plastic material so that it can be mounted on existing corner edges of a wall corner without obstructing the view of an adjacent painted wall or wall paper covering.

Still, one other object of this invention is to provide a corner light switch assembly being of L-shape so as to be mounted on a corner edge of a wall corner permitting a subject corner light switch sensor to be readily found by one in the dark in order to energize a light fixture, appliance, or the like and being economical to manufacture; easy to install; substantially low cost; easy to locate in the dark after finding the wall corner; and substantially maintenance free.

Another object of this invention is to provide a touch sensitive switch assembly which can be connected between the load, such as an appliance or light fixture, to be connected in a phase terminal of an alternating current supply without direct access to a neutral line of the supply.

A further object of this invention is to provide a touch sensitive switch assembly which will alternately connect and disconnect a load from an AC supply in response to each respective sequential touching of a touch plate sensor.

Various other objects, advantages, and features of the invention will become apparent to those skilled in the art from the following discussion, taken in conjunction with the accompanying drawings, in which:

FIGURES OF THE INVENTION

Figure 1:
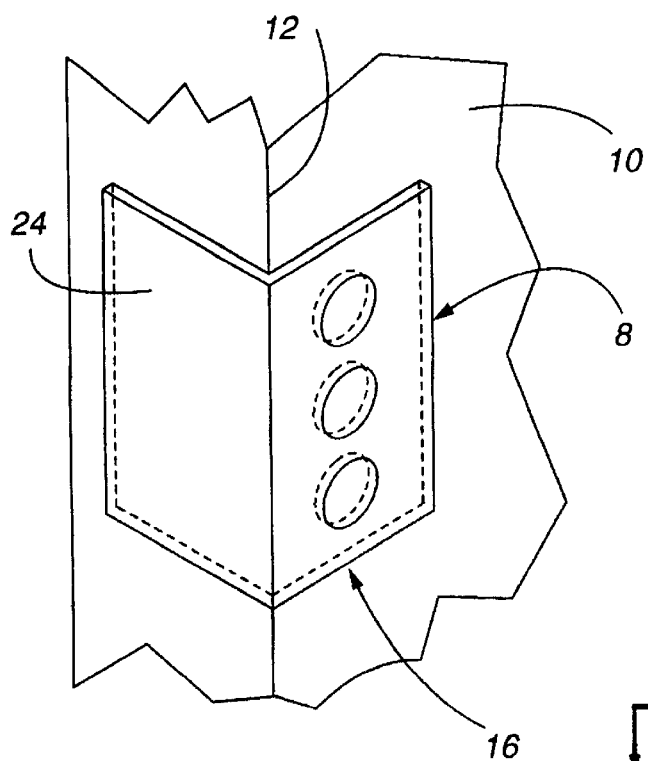
FIG. 1 is a perspective view of a corner light switch assembly of this invention as mounted against and about a corner edge on a corner wall.
Figure 2:
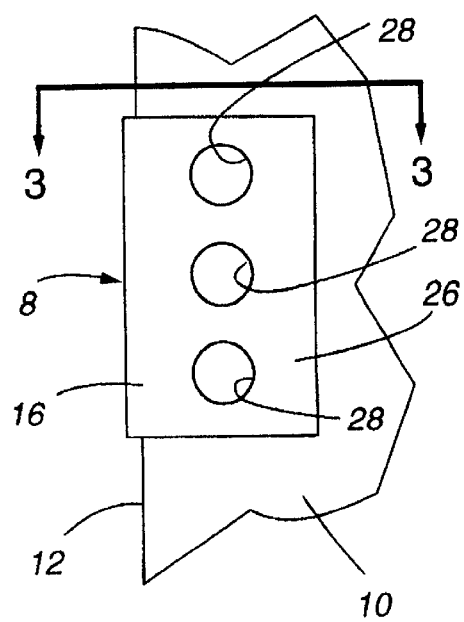
FIG. 2 is a front elevational view thereof.

The following is a discussion and description of preferred specific embodiments of the corner light switch assembly of this invention, such being made with reference to the drawings, whereupon the same reference numerals are used to indicate the same or similar parts and/or structure. It is to be understood that such discussion and description is not to unduly limit the scope of the invention.

DESCRIPTION OF THE INVENTION

On referring to the drawings in detail, and in particular to FIG. 1, a corner light switch assembly of this invention, indicated generally at 8, is utilized to be mounted about a wall corner 10 having a corner edge 12.

In the prior art, a light switch assembly is normally mounted flat against a wall portion and, therefore, is very hard to find in low light or dark situations. By placing the corner light switch assembly 8 of this invention about a corner edge 12, a person need only find this corner edge 12 with their hand in the dark and run the hand vertically and will find contact with the corner light switch assembly 8 of this invention. Then, the user thereof would only have to find a touch plate sensor 11 as will be explained in order to energize an appliance, table lamp, or a light fixture for energizing the same.

The advantages of the corner light switch assembly 8 are fairly obvious when trying to locate same in a darkened area.

The corner light switch assembly 8 includes 1) a main switch body 14; 2) a switch body cover plate 16 connected to the main switch body 14; 3) a touch sensitive switch assembly 18 having a plurality, namely three, and connected to and mounted within the main switch body 14; and 4) a power supply cord 20 to provide power from the touch sensitive switch assembly 18 to the appliances, table lamp or light fixture in a manner to be explained.

The main switch body 14 resembles a conventional electrical receptacle box having a receptor box 22 secured by conventional anchor members (not shown) to the corner edge 12 of the wall corner 10 in a conventional manner. It is obvious that nails, anchor screws, and the like can be used to attach the receptor box 22 to the aforementioned wall corner 10 area.

The switch body cover plate 16 is of a generally L-shape and preferably constructed of a transparent plastic material. The transparent plastic material is desirable as does not cover up wall paper or existing wall paint thereunder without requiring additional work and worrying about the wall covering when installing in a wall corner 10 area.

Figure 3:
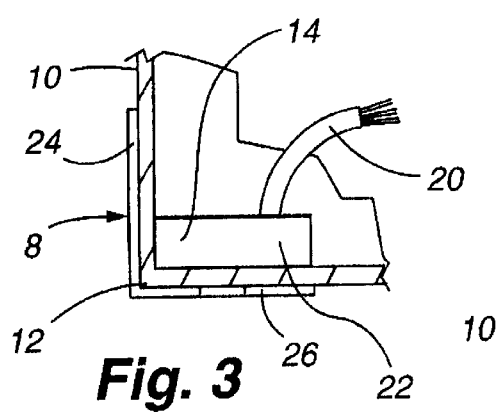
FIG. 3 is a fragmentary sectional view taken along line 3—3 in FIG. 2.

The switch body cover plate 16 includes a support section 24 integral with a sensor section 26 which extends perpendicular to the support section 24. Therefore, there is a 90 degree corner formed between the interconnection of the support section 24 and the sensor section 26 for lying flush against the corner edge 12 of wall corner 10 as noted in FIGS. 1 and 3.

The sensor section 26 is provided with a plurality, namely three, sensor openings 28, each to receive a portion of respective ones of the touch sensitive switch assemblies 18 as will be explained.

Each of the touch sensitive switch assemblies 18 include a touch plate sensor 11 connected to, controlled, and energized by a touch sensitive switch circuit 32.

The touch plate sensor 11 can be of a circular shape and of a size to be received in a respective one of the the sensor openings 28 in the sensor section 26 of the switch body cover plate 16. An outer surface of the touch plate sensor 11 can be flush or protrude slightly from an outer respective surface surrounding the sensor openings 28 in the sensor section 26.

The touch plate sensor 11 need only contact a person's body in order to complete or break an electrical circuit to its respective appliance, table, lamp, or light fixture as will be explained.

Figure 4:
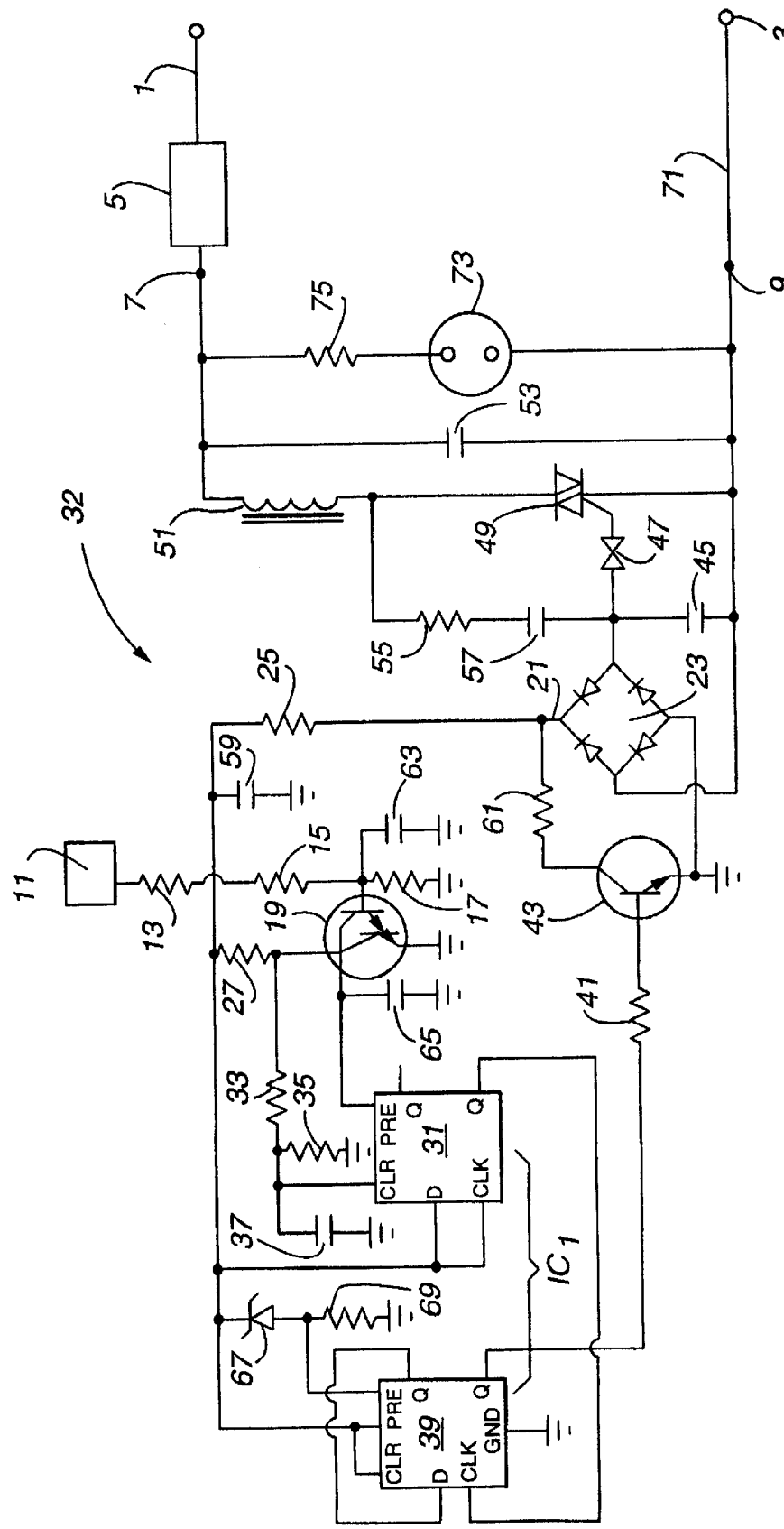
FIG. 4 is a electrical schematic diagram of a touch switch circuit of this invention.

On referring to FIG. 4, the touch sensitive switch circuit 32 is showing an alternating voltage and current source having a neutral line 1 and a phase line 3. A load 5 which can be a household appliance, for example, is connected at one end to the neutral line 1 and at the other end to a load terminal 7 of the touch sensitive switch assembly 18. A phase terminal 9 of the touch sensitive switch assembly 18 is connected to the phase line 3 of the alternating voltage source.

The touch plate sensor 11 having a conductive surface, is connected to ground through series resistors 13, 15, and 17. The junction between resistors 15 and 17 is connected to the base of a transistor comprising the first stage of a Darlington amplifier 19.

A person standing within reach of the touch plate sensor 11 is within the electric field generated by the alternating voltage source and has impressed across his body a voltage due to the capacitive effect of the body. When the person touches the touch plate sensor 11, the voltage is applied between the touch plate sensor 11 and ground causing a very small current to flow through resistors 13, 15 and 17 to ground. Resistors 13 and 15 are each, in the preferred embodiment, 4.7 megohms and hence the current is extremely small, on the order of less than 25 microamperes. Resistor 17, in the preferred embodiment, is 470 kiloohms. Positive current flow from the touch plate sensor 11 to ground causes a voltage drop across resistor 17 which raises the potential of the base of the Darlington amplifier 19 above ground sufficiently to render the Darlington amplifier 19 conducting. This results in a flow of direct current from the positive output 21 of a bridge rectifier 23 through a resistor 25 having a value of 10,000 ohms, through a resistor 27 having a value of 470 kilo-ohms connected directly to the output of the Darlington amplifier 19 at the collector of its output transistor and from the reset input of a bistable multivibrator 31. The application of a positive voltage to the reset input of the multivibrator 31 causes the Q output of the multivibrator 31 to go to a high state. The positive voltage from the resistor 27 is also applied to the clear input of the multivibrator 31 through an RC delay network including resistors 33 and 35 which have values of 1 megohm and 10 megohms respectively, and a capacitor 37 which has a value of 0.0033 microfarads. Application of the positive signal to the clear input of the multivibrator 31 through the delay network causes the Q output of the multivibrator 31 to go low. Hence the Q output of the multivibrator 31 is a high-going or positive pulse having a width dependent on the time constant of the delay network including resistors 33 and 35 and capacitor 37.

The Q output of the bistable multivibrator 31 is directly connected to the clock input of a bistable multivibrator 39. The Q output of the multivibrator 39 is directly connected to its D input so that each time a positive pulse appears at the clock input, the Q and Q outputs reverse states. Since the Q and Q states are always opposites or inverses of one another, that is when Q is high Q is low and when Q is low Q is high, each time a positive pulse appears at the clock input of the multivibrator 39 of the Q output changes to a low state if it was previously in a high state and changes to a high state if it was previously in a low state. The Q output of the multivibrator 39 is connected through a resistor 41 having a value of 56 kilo-ohms to the base of a transistor 43 which is connected in parallel with the output of the bridge rectifier 23.

Upon appearance of a positive signal at the Q output of the bistable multivibrator 39, that is when the Q output is in a high state, the transistor 43 is rendered conducting thereby placing a load on the rectifier 23 so that current is drawn from a 0.047 microfarad capacitor 45 which is connected between the phase terminal 9 of the touch sensitive switch assembly 18 and a diac 47 which is in turn connected to the control gate of a triac 49. When the transistor 43 is non-conducting, the voltage on capacitor 45 is sufficient to overcome the breakdown threshold of the diac 47 and actuate the triac 49 to render it conducting. When the transistor 43 conducts, the load it presents to the capacitor 45 through the rectifier 23 prevents the voltage across the capacitor 45 from reaching the breakdown level of the diac 47 so that the triac 49 does not conduct.

The triac 49 is connected in series with an inductor 51 and the triac 49 and inductor 51 are in parallel with a capacitor 53. The inductor 51 and the capacitor 53 provide high frequency transient suppression. The inductor 51 is sized according to the size of the load 5 whereas the capacitor 53, in the preferred embodiment, has a value of 0.047 microfarad.

A resistor 55 and a capacitor 57 are connected between the suppression inductor 51 and the diac 47 to insure that the triac 49 is rendered non-conducting during at least a portion of the cycle of the alternating voltage so that there is sufficient output voltage from the bridge rectifier 23 to power the DC circuitry in the touch sensitive switch assembly 18. In the preferred embodiment, resistor 55 has a value of 3.3 kilo ohms and capacitor 57 has a value of 0.22 microfarads.

The AC voltage across the capacitor 45 is applied to the input of the bridge rectifier 23 to provide the DC voltage that drives the switch circuitry. This DC voltage is filtered by a 3.3 microfarad capacitor 59 and regulated by resistor 25, diac 47, resistor 55, capacitor 57 and a 1.8 kilo-ohm resistor 61 connected between the positive output of the bridge rectifier 23 and the collector of transistor 43 so that the DC voltage stays within a range of approximately 6 to 14 volts irrespective of whether the load 5 is turned on or off or the voltage on the AC line is at a high or low portion of its cycle.

Capacitor 63 and 65, having values of 0.033 microfarads and 0.22 mircrofarads respectively, filter transients at the input and output of the Darlington amplifier 19 respectively.

In order to insure that an interruption in the power supplied on the AC line does not cause the load 5 to be energized without actuation by touching the touch plate sensor 11, circuitry is provided to insure that the Q output of the bistable multivibrator 39 is high following any power interruption. A zener diode 67 is connected between the positive output of the rectifier 23, downstream of resistor 25, and a 68 kilo-ohm resistor 69 which is connected to ground. The juncture of the resistor 69 and zener diode 67 is connected to the reset input of the bistable multivibrator 39. As a consequence of this arrangement, the reset input of the multivibrator 39 is held at ground potential following a power interruption until the voltage downstream of resistor 25 builds up sufficiently to a level to exceed the breakdown voltage of the zener diode 67 at which time the multivibrator 39 will not change states except when caused to do so by a touch of the touch plate sensor 11.

The operation of the touch sensitive switch assembly 18 will now be explained beginning under assumption of a condition where the alternating line voltage between the neutral line 1 and a phase line 3 is active and the load 5 is turned off, that is, the triac 49 is in a non-conducting state. Under these conditions, the Q output of the multivibrator 39 is high and the transistor 43 is conducting so that the voltage across capacitor 45 is below the threshold necessary to overcome the breakdown voltage of the diac 47 to actuate the triac 49. If a person wishing to turn the load 5 "on" touches the touch plate sensor 11, a current flows through resistor 17 thereby rendering the Darlington amplifier 19 conductive so that a positive voltage is applied to the reset input of the bistable multivibrator 31 making its Q output go high and, shortly thereafter, a positive voltage is applied to the clock input of the multivibrator 31 again rendering the Q output low. The resultant positive pulse at the Q output of the multivibrator 31 is applied to the clock input of multivibrator 39 thereby changing its Q output from high to low. The low signal at the Q output of multivibrator 39 causes transistor 43 to stop conducting thereby removing the load 5 including resistor 61 from the output of the bridge rectifier 23. This results in a rise in the AC voltage across capacitor 45 sufficient to overcome the breakdown threshold of the diac 47 and to render the triac 49 conducting. The load 5 is now connected between the neutral line 1 and phase line 3 of the alternating voltage supply through inductor 51 and triac 49.

If the touch plate sensor 11 is touched a second time, the Darlington amplifier 19 is again momentarily rendered conductive, a positive pulse is produced at the Q output of multivibrator 31 as heretofore explained, and the Q output of multivibrator 39 goes from low to high. The high Q output causes transistor 43 to conduct thereby loading capacitor C5 through the rectifier 23 and limiting the voltage across the capacitor 45 to below the threshold necessary to overcome the breakdown voltage of the diac 47. Triac 49 then ceases conducting and the load 5 is turned off.

In order to insure that the load 5 can be completely isolated from the phase line of the alternating voltage supplied in the event of a circuit failure in the touch sensitive switch circuit 32, a mechanical air gap switch 71 can be connected between the phase terminal 9 and the triac 49. The air gap switch 71 is preferably a push-push switch having a movable actuator which successively changes the state of the air gap switch 71 from open to closed or from closed to open depending on its previous state each time the push button is actuated. Such mechanical switches are commercially available and will be known to those skilled in the art. For convenience, the push button actuator of the mechanical air gap switch can be mounted behind the touch plate sensor 11 and the touch plate sensor 11 can be movably mounted so that pressure on the touch plate beyond a predetermined mount will actually move the touch plate against the push button thereby actuating the mechanical switch 71. Hence, if the touch plate is touched to turn the load 5 on or off and the touch sensitive switch fails to properly operate, additional pressure can be applied to the touch plate to actuate the mechanical actuator of the air gap switch 71 which can be opened to disconnect the load 5 from the source of alternating voltage or closed to reconnect the load 5 after the switch 71 has previously been opened.

An indicator light 73 in series with a limiting resistor 75 can be connected between the load terminal of the touch sensitive switch assembly 18 and the terminal of the air gap switch 71 which is opposite the phase terminal 9 of the touch sensitive switch assembly 18. When the indicator light 73 is lit, it will indicate that the air gap switch 71 is closed and when unlit it will indicate that the air gap switch 71 is open.

The power cord 20 includes the normal and required plus, minus, and ground wires to be connected to a respective plug-in wall receptacle, an appliance, a lamp, or a light fixture to control operation thereof. The power cord 20 is also connected to the touch sensitive switch circuit 32 to supply power to each touch sensitive switch assembly 18.

USE AND OPERATION OF THE INVENTION

In the use and operation of the corner light switch assembly 8 of this invention, the users thereof would determine a particular wall corner area in which to mount same. This may be a wall corner area that is adjacent to an exterior door so that one can immediately activate lights on entering a darkened room on a light fixture or a table lamp if so desired.

The corner light switch assembly 8 would be placed against the corner edge 12 on the wall corner 10 and attached thereto as by anchor members which can be screws, lug bolts, nails or the like in a conventional manner.

The user thereof would determine a particular vertical height in which to place the corner light switch assembly 8 depending on whether or not it is desirable for children to have access thereto and, if so, to be placed at a lower height on the corner edge 12.

The power cord 20 can then be supplied to three different areas of use, such as an appliance, being a house heater, a table lamp fixture, or a light fixture. These can be remotely located from the actual location of the corner light switch assembly 8 and it is well known to one skilled in the art on how to attach the subject appliance, table lamp, or light fixture.

The touch plate sensors 11, being three thereof, are shown as mounted within the sensor openings 28 in the sensor section 26 of the switch body cover plate 16. One merely has to touch the respective ones of the touch plate sensors 11 to cause a grounding action and can turn on a table lamp.

Also, it is known in the prior art that, for example, on a table lamp that subsequent touching thereof can 1) energize the table lamp; and 2) act as a brightening and dimming action on repeated touching thereof. For example, the first touch may energize the table lamp, subsequent touching will increase the light intensity, and a last touching may de-energize the table lamp. The use in this matter is known in the prior art.

The corner light switch assembly of this invention is easy to install; simple to use; economical to manufacture; provides a convenient way on a corner edge to find the corner light switch assembly for ease of operation; and substantially maintenance free.

While the invention has been described in conjunction with preferred specific embodiments thereof, it will be understood that this description is intended to illustrate and not to limit the scope of the invention, which is defined by the following claims:

I claim:

1. A corner light switch assembly adapted to be mounted on a corner edge of a wall corner, comprising:
    a) a main switch body having a switch body cover plate connected thereto;
    b) said switch body cover plate mounted vertically on and encloses an inner or outer corner edge of a wall corner;
    c) a touch sensitive switch assembly connected to said main switch body and to an electrical appliance; and
    d) said touch sensitive switch assembly includes a touch plate sensor; and, when said touch plate sensor is contacted by a person, electrical current flows to the appliance to cause energization thereof.

2. A corner light switch assembly as described in claim 1, wherein:
    a) said switch body cover plate includes a support section intregal with a sensor section; and
    b) said sensor section includes a sensor opening having said touch plate sensor mounted therein allowing the person to insert a finger through the sensor opening to contact said touch plate sensor and control power supply to the appliance.

3. A corner light switch assembly as described in claim 2, wherein:
    a) said sensor section having a plurality of vertically spaced sensor openings therein; and
    b) a plurality of said touch sensitive switch assembly provided, each mounted in a respective one of said sensor openings and connected to a respective appliance.

4. A corner light switch assembly as described in claim 3, wherein:
    a) each of said touch sensitive switch assemblies operable to electrically energize, de-energize, and control level of power supply to the respective appliance.

5. A corner light switch assembly adapted to be mounted on a corner edge of a wall corner, comprising:
    a) a main switch body having a switch body cover plate connected thereto;
    b) said main switch body mounted vertically on a corner edge of a wall corner;
    c) a touch sensitive switch assembly connected to said main switch body and to an electrical appliance;
    d) said touch sensitive switch assembly includes a touch plate sensor; and, when said touch plate sensor is contacted by a person, electrical current flows to the appliance to cause energization thereof; and
    e) said switch body cover plate of an L-shape operable to surround and enclose a portion of the corner edge thus being easy to locate in a dark area with a person's hand on locating the wall corner.

6. A corner light switch assembly as described in claim 5, wherein:
    a) said switch body cover plate constructed of a transparent material which reveals an underlying wall surface.

7. A corner light switch assembly adapted to be mounted on a corner edge of a wall corner, comprising:
   a) a main switch body having a switch body cover plate of an L-shape connected thereto;
   b) said main switch body mounted at a preselected height on a corner edge of a wall corner;
   c) a touch sensitive switch assembly connected to said main switch body and to an electrical light fixture;
   d) said touch sensitive switch assembly includes a touch plate sensor; and, when said touch plate sensor is contacted by a person, electrical current flows to the light fixture to cause energization thereof; and
   e) said switch body cover plate contacts and encloses an inner or outer corner edge of the wall corner.

8. A corner light switch assembly adapted to be mounted on a corner edge of a wall corner, comprising:
   a) a main switch body having a switch body cover plate connected thereto;
   b) said main switch body mounted at a preselected height on a corner edge of a wall corner;
   c) a touch sensitive switch assembly connected to said main switch body and to an electrical light fixture;
   d) said touch sensitive switch assembly includes a touch plate sensor; and, when said touch plate sensor is contacted by a person, electrical current flows to the light fixture to cause energization thereof; and
   e) said switch body cover plate includes a support section with a sensor section so as to be of L-shape to completely surround and enclose a portion of the corner edge.

9. A corner light switch assembly as described in claim 8, wherein:
   a) said sensor section includes a sensor opening having said touch plate sensor mounted therein allowing the person to insert a finger through the sensor opening to control power supply to the light fixture.

10. A corner light switch assembly as described in claim 8, wherein:
   a) said sensor section having a plurality of spaced sensor openings therein; and
   b) a plurality of said touch sensitive switch assembly provided, each mounted in a respective one of said sensor openings and connected to a respective light fixture.

11. A corner light switch assembly as described in claim 10, wherein:
   a) each of said touch sensitive switch assemblies operable to electrically energize, de-energize, and control level of power supply to the respective light fixture.

12. A corner light switch assembly adapted to be mounted on a corner edge of a wall corner, comprising:
   a) a switch body cover plate adapted to be connected at a selected height on a corner edge of a wall corner;
   b) said switch body cover plate of an L-shape to receive and enclose the corner edge so as to be easily located under conditions of darkness;
   c) a touch sensitive switch assembly connected to said switch body cover plate and to an electrical member; and
   d) said touch sensitive switch assembly includes a touch plate sensor; and, when said touch plate sensor is contacted by a person, electrical current flows to the electrical member to achieve selective operation thereof.

13. A corner light switch assembly as described in claim 12, wherein:
   a) said switch body cover plate includes a support section intregal with a sensor section to completely surround and enclose a portion of the corner edge;
   b) said sensor section includes a plurality of sensor openings; and
   c) a plurality of said touch sensitive switch assembly provided with a respective touch plate sensor mounted in respective ones of said sensor opening.

* * * * *